United States Patent [19]
Ruegg

[11] 3,911,470

[45] Oct. 7, 1975

[54] INTEGRATED CIRCUIT FOR LOGIC PURPOSES HAVING TRANSISTORS WITH DIFFERENT BASE THICKNESSES AND METHOD OF MANUFACTURING SAME

[75] Inventor: Heinz Walter Ruegg, Hausena, Switzerland

[73] Assignee: U.S. Philips Corporation, New York, N.Y.

[22] Filed: Oct. 18, 1974

[21] Appl. No.: 515,973

Related U.S. Application Data

[63] Continuation of Ser. No. 198,223, Nov. 12, 1971, abandoned, and Ser. No. 382,543, July 25, 1973, abandoned.

[30] Foreign Application Priority Data

Nov. 14, 1970 Netherlands ....................... 7016710

[52] U.S. Cl. ....................... 357/36; 357/34; 357/35; 357/40; 357/48

[51] Int. Cl.[2] ........................................ H01L 29/72

[58] Field of Search ............. 357/35, 36, 40, 34, 43, 357/47, 48

[56] References Cited

UNITED STATES PATENTS

| | | | |
|---|---|---|---|
| 3,218,613 | 11/1965 | Gribble et al. | 357/35 |
| 3,312,882 | 4/1967 | Pollock | 357/36 |
| 3,414,783 | 12/1968 | Moore | 357/40 |
| 3,506,893 | 4/1970 | Dhaka | 357/40 |
| 3,524,113 | 8/1970 | Augusta et al. | 357/40 |
| 3,525,911 | 8/1970 | Ryerson | 357/36 |
| 3,566,218 | 2/1971 | Widlar | 357/40 |
| 3,617,778 | 11/1971 | Korom | 357/40 |

OTHER PUBLICATIONS

IBM Tech. Discl. Bull., Semiconductor Structure, by Berger et al., Vol. 13, No. 1, June 1970, p. 295.

Def. Pub. Ser. No. 769,261, Semiconductor Integrated Circuit, by Lin, April 1969.

French Abstract, No. 2101228, May 5, 1972.

*Primary Examiner*—Andrew J. James
*Attorney, Agent, or Firm*—Frank R. Trifari; Leon Nigohosian

[57] ABSTRACT

The invention relates to logic integrated circuits in which the collector of a multi-emitter transistor is connected to the base of a further transistor, as for example in TTL circuits. The base zone of the multi-emitter transistor is provided simultaneously with the isolation zones and strikes on a buried collector layer which separates such base zone from the substrate. Said multi-emitter transistor has a low $\beta$ inverse as a result of which the reaction to preceding parts of the logic circuit, particularly with small voltages, is comparatively small.

7 Claims, 7 Drawing Figures

INVENTOR.
HEINZ W. RUEGG

BY [signature]
AGENT

INVENTOR.
HEINZ W. RUEGG
BY
AGENT

INVENTOR.
HEINZ W. RUEGG
BY
AGENT

INTEGRATED CIRCUIT FOR LOGIC PURPOSES HAVING TRANSISTORS WITH DIFFERENT BASE THICKNESSES AND METHOD OF MANUFACTURING SAME

BACKGROUND OF THE INVENTION

The present invention is a continuation of applications Ser. No. 198,223, filed Nov. 12, 1971, (now abandoned) and Ser. No. 382,543, filed July 25, 1973, (now abandoned).

The invention relates to an integrated circuit for logic purposes, in which the collector of a multi-emitter transistor used as a gate is connected to the base of a further transistor of the same conductivity type, and in which a surface layer of the second conductivity type situated on a substrate of a first conductivity type is divided into islands of the second conductivity type by means of isolation diffusion zones of the first conductivity type which extend from the surface into the substrate, the transistors in the islands being each provided above a local buried layer of the second conductivity type situated at the interface between the substrate and the surface layer. The invention furthermore relates to a method of manufacturing such an integrated circuit.

Circuits of this type having multi-emitter transistors are often used as a base circuit in circuits for logic systems known as "TTL" (Transistor Transistor Logic) circuits in which usually both the multi-emitter transistors and the further transistors are n-p-n type transistors. Such a base circuit, which may be completed by further integrated elements, for example, by further transistors of the n-p-n or p-n-p type and resistors may be constructed individually as a separate integrated circuit; however, several such base circuits are often integrated, if necessary with further circuits, to form a larger functional unit or a system in a monolithic semiconductor device.

The manufacture is usually carried out as follows:

Starting material is a p-type substrate which is locally provided in the desirable places with diffused n-type highly doped layers on which subsequently an n-type epitaxial layer of, for example, approximately 10 $\mu$m is grown.

In a first step, a first deep diffusion is carried out in which, by means of usual diffusion-masking techniques acceptor material is diffused from the surface through the n-type epitaxial layer to form the local p-type isolation diffusion zones. So in this manner n-type epitaxial islands are obtained which are surrounded laterally by the upright p-type diffusion walls. At the interface between the islands and the substrate the highly doped $n^+$ type layers (so-called buried layers) are locally present which, during this and other diffusion treatments, may penetrate over a small distance, for example, 5 $\mu$m, into the epitaxial layer which is, for example, 10 $\mu$m thick.

Another two diffusion treatments are then carried out, namely a p-type diffusion with a comparatively small depth of penetration and an n-type diffusion with an even smaller depth of penetration. In the p-type diffusion, inter alia p-type base zones of all the desirable n-p-n transistors are diffused in the epitaxial layer to a depth of penetration of, for example, up to 3 $\mu$m, if desirable such base zone being produced simultaneously with further desirable p-type zones, for example, the p-type emitter zones and the p-type collector zones of lateral p-n-p transistors. In the n-type diffusion, the n-type emitter zones of the n-p-n transistors are locally diffused in the p-type base zones and furthermore, beside the emitter zones, there can be diffused desirable collector contact layers, if any, as well as further n-type zones required for other elements to be integrated, for example, the base contact layers of lateral p-n-p transistors.

In the known integrated circuits the various elements to be integrated are thus incorporated simultaneously in various places in the semiconductor slice with the use of the above-mentioned diffusion steps. Elements of the same type, for example, the n-p-n transistors, show the same parameters with respect to doping and depth of penetration of the various zones, however, with the possibility of different lateral expansion. The parameters of the diffusion steps are chosen to be so that there are obtained the properties desirable for the various elements, for example, a high current amplification factor, a high breakdown voltage, and low values of the saturation voltages for the further so-called inverter succeeding the multi-emitter transistor. For that purpose, inter alia, the p-type diffusion which determines the base zone and the collector junction is carried out over a rather small depth in the n-type epitaxial layer so that the p-n junction is formed at a certain distance from the buried layer, the collector zone changing, via an intermediate layer consisting of the original high-ohmic epitaxial n-type material, into the highly doped buried layer situated below it.

It is furthermore known, inter alia in manufacturing multi-emitter transistor circuits of the above-mentioned type, to carry out a gold diffusion, as a result of which the life time of the charge carriers is shortened and hence the storage time and the inverse current amplification factor $\beta_{inverse}$ of the multi-emitter transistor are considerably reduced without the current amplification factor $\beta$ of the remaining transistors being reduced too strongly. As is known, a low $\beta_{inverse}$ of the multi-emitter transistor is required because in one of the operating conditions, namely in the conductive condition of the gate, the multi-emitter junction is polarized in the reverse direction and the collector junction is polarized in the forward direction. The switching-on base current of the connected inverter flows in the collector which operates as an emitter and with a high $\beta_{inverse}$ of the multi-emitter transistor a high input current would thus be required at the gate, as a result of which a correspondingly large reaction and load of the preceding stage would occur.

However, it may be desirable for some reason or another to omit the gold diffusion or at least reduce it considerably, for example, when further lateral p-n-p transistors are used in the integrated circuit since the gold could reduce to an undesirable extent the $\beta$ value of the lateral transistors, which already is not high.

OBJECTS OF THE INVENTION

One of the objects of the invention is to provide another measure which enables in a simple manner the reduction of the reaction of the multi-emitter transistor to a considerable extent so that the diffusion of gold may be omitted entirely or be considerably restricted.

SUMMARY OF THE INVENTION

According to the invention, in an integrated circuit of the above-mentioned type the base zone of the multi-emitter transistor consists of a zone of the first conductivity type diffused in the surface layer during the diffusion of the isolation zones and extending into the associated highly doped buried layer and forming therewith the collector junction of the multi-emitter transistor, the base zone of the further transistor being diffused in the surface layer down to a smaller depth and having a correspondingly smaller thickness.

The integrated circuit according to the invention can be manufactured in a particularly simple manner by diffusing simultaneously the base zone of the multi-emitter transistor and the isolation zones in a epitaxial layer, which epitaxial layer has a substantially homogeneous thickness, is of the second conductivity type and is present on a support of the first conductivity type and locally has highly doped buried layers of the second conductivity type situated at the interface between the substrate and the layer, the diffused isolation zones extending transversely through the epitaxial layer and the base zone; intersecting the buried layer and forming therewith the collector junction. The diffusion of the base zone of the further transistor is carried out over a smaller depth and preferably in a subsequent separate diffusion treatment.

The circuit arrangement according to the invention has a considerably lower $\beta_{inverse}$ of the multi-emitter transistor because, since the base zone of the multi-emitter transistor produced according to the invention meets or intersect the highly doped buried layer and forms therewith the collector junction, the concentration gradients of the dopings near the p-n junction are considerably larger than in the known multi-emitter transistor in which the base zone and the collector junction are situated at a given distance from the buried layer located in the original epitaxial material which is higher ohmic. Consequently, particularly with comparatively low currents and voltages, the injection of charge carriers in a direction transverse to the surface from the collector side directly into the base zone is considerably reduced with the same voltage at the p-n junction, so that a considerable reduction of the $\beta_{inverse}$ compared with the known transistor is possible. In addition, the thickness of the base zone of the multi-emitter transistor is considerably larger and preferably in the proximity of 5 $\mu$m so that for this reason also the $\beta_{inverse}$ is reduced. Although as a result of the increase of the thickness of the base zone the $\beta$ of the multi-emitter transistor is also reduced, no high requirements are imposed upon the multi-emitter transistor in this respect and also with respect to the breakdown voltage (due to the polarization in the forward direction of the p-n junction) and so long as $\beta$ is so high that the multi-emitter transistor can conduct away the collector-base leakage current $I_{CBO}$ of the inverter, a good performance is possible. In the extreme case in which, for example, the leakage current $I_{CBO}$ is approximately 100 nA and the base current of the multi-emitter transistor is only approximately 1 $\mu$A, $\beta$ would have to be at least equal to 0.1. By a suitable choice of the thickness of the epitaxial layer, of the depth of penetration of the buried layer in the epitaxial layer, and of the depth of penetration of the emitter, the thickness of the base zone of the multi-emitter transistor may be chosen to be arbitrary, the advantage being maintained that further n-p-n transistors, for example the inverter, in which the parameters of the base zones can be chosen independently in the subsequent diffusion, can nevertheless be defined in an optimum manner and independently with a high current amplification factor, a high breakdown voltage and a low value of the substrate voltage. The favourable different construction of the multi-emitter transistor and of the further transistor can be manufactured by means of the above-mentioned method without extra diffusion steps with respect to the known method because the only difference is that the base zone of the multi-emitter transistor is diffused, instead of simultaneously with base zones of other transistors, in an earlier stage simultaneously with the isolation diffusion zones. This means that the diffusion window for the base zone of the multi-emitter transistor is opened already during the provision of the windows for the isolation diffusion instead of during the provision of the windows for the subsequent diffusion of the other base zones.

The invention may advantageously be used in integrated circuits of the above-mentioned type having multi-emitter transistors in which, in addition to one or more multi-emitter transistors and inverters, other circuit elements are integrated in the same semiconductor body and are incorporated simultaneously in the same manufacturing steps. With a view to the possibility of a reduction and omission, respectively, of the gold diffusion, the invention is particularly advantageous for those circuits of the above-mentioned type in which lateral transistors, which are of the opposte type and having diffused emitter and collector zones of the same conductivity type as the base zone of the multi-emitter transistor situated laterally beside each other, are also diffused in the same epitaxial layer. Such so-called complementary transistors are used in logic circuits of this type particularly as loads instead of resistors, in the case of low power circuits, for example, microwatt circuits. Since such circuits are operated with low currents and voltages, the advantage of the reduction of $\beta_{inverse}$ can be used in this case in particular, while in addition the current amplification factor of the complementary lateral transistors is comparatively high because the gold diffusion may be omitted. Particularly when at least the emitter zones of the complementary transistors are obtained simultaneously with the base zone of the multi-emitter transistor, the transverse injection of the emitter zones is reduced in addition.

BRIEF DESCRIPTION OF DRAWINGS

In order that the invention may be readily carried into effect, one embodiment thereof will now be described in greater detail, by way of example, with reference to the accompanying drawings, in which FIG. 1 shows the circuit diagram of an example of the integrated circuit according to the invention, of which

PREFERRED EMBODIMENT Z

Figure 1:
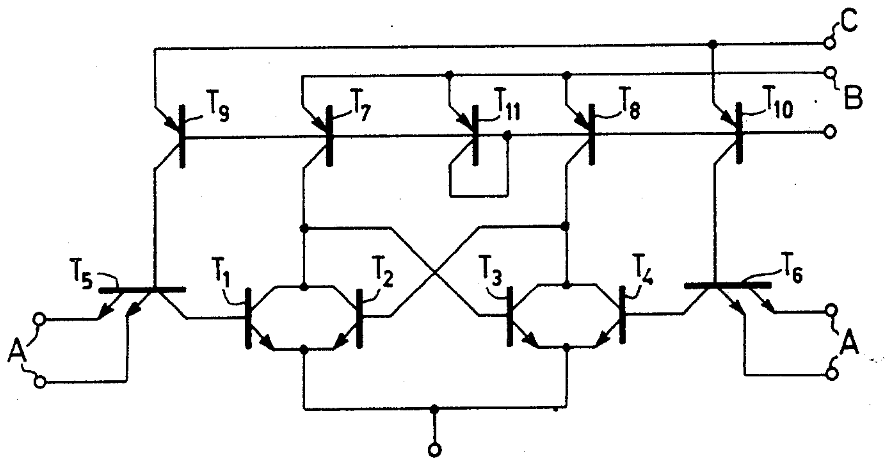

An embodiment of an integrated circuit will now be described the diagram of which is shown in FIG. 1. The four n-p-n transistors $T_1$ to $T_4$ form a flip-flo which can be controlled by means of the two multi-emitter n-p-n transitors $T_5$ and $T_6$ used as a gate and the collector zones of which are connected to base zone of the transistors $T_1$ and $T_4$, respectively. P-n-p transistors $T_7$ to $T_{10}$ are used as loads of the six n-p-n transistors i.e., $T_1$ to $T_6$. The base zones of the p-n-p transistors are connected together. The emitter zones of the p-n-p transistors $T_7$ and $T_8$ are also connected together while the diagram furthermore shows a further p-n-p transistor $T_{11}$ which is connected as a diode and which, together with transistors $T_7$ and $T_8$, constitutes in known manner two current sources. Furthermore, the emitter zones of the p-n-p transistors $T_9$ and $T_{10}$ are connected together. These transistors, together with $T_{11}$, also form two current sources when the connections B and C are connected together. The last-mentioned connection may comprise a resistor with which the ratio of the currents of the two pairs of current sources can be adjusted.

With respect to the integration, the use of p-n-p transistors has the advantage that these can be avoided the more conventional load resistors which may be very large particularly with small currents and voltages, for example in the microwatt range, and then occupy accordingly much place at the semiconductor surface. In addition, such high-value resistors also influence the switching speed unfavourably.

Figure 2:
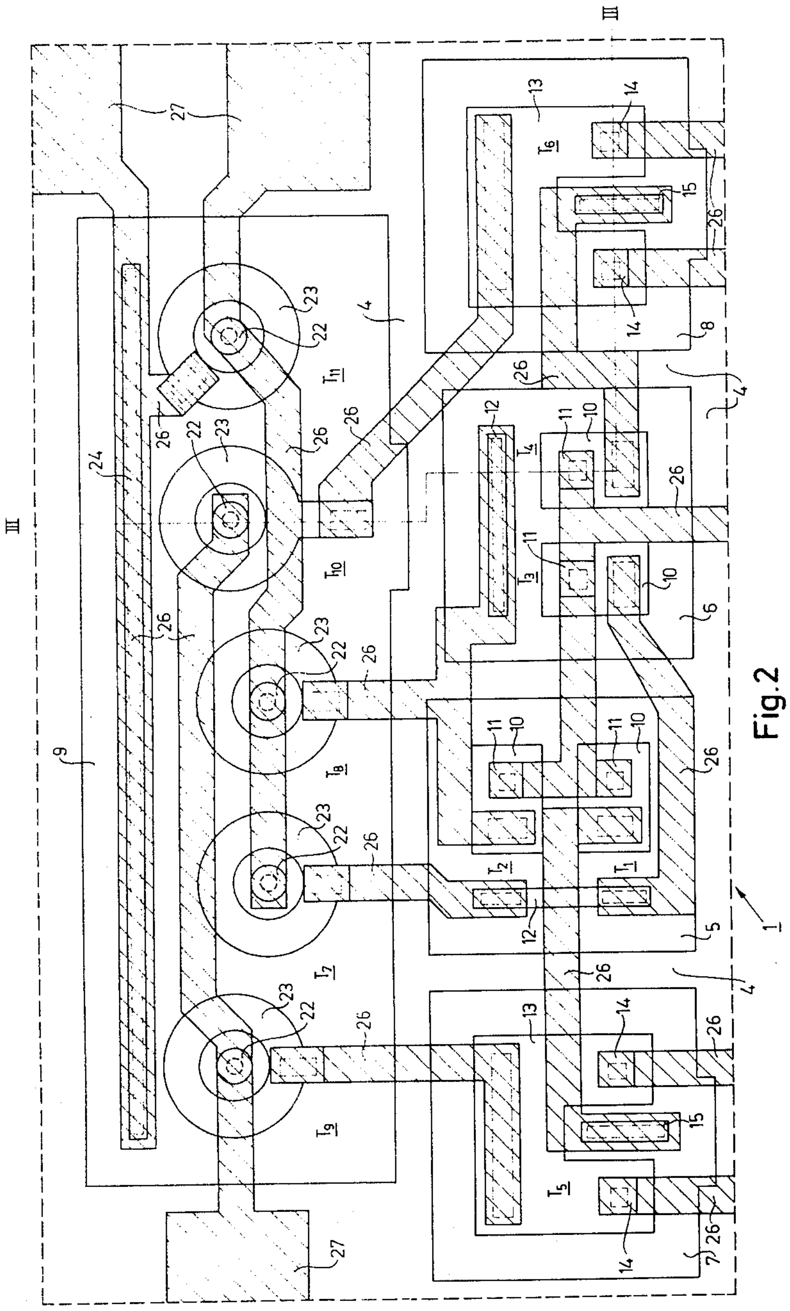
FIG. 2 is a diagrammatic plan view of the semiconductor body.
Figure 3:
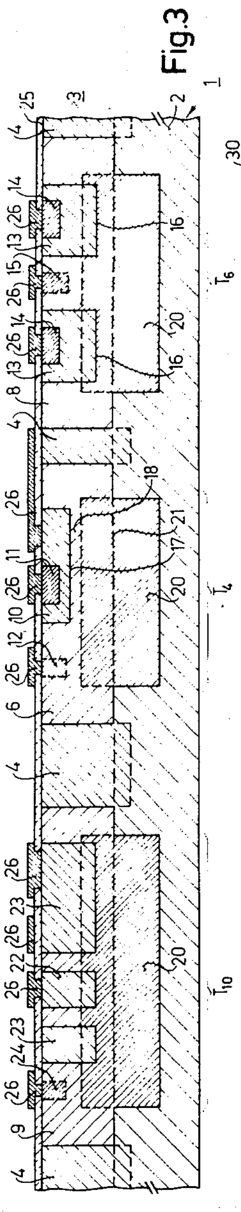
FIG. 3 is a diagrammatic cross-sectional view of the integrated circuit shown in FIG. 2 taken on the line III-III of FIG. 2.

FIGS. 2 and 3 show how the circuit can be integrated, for example, in a semiconductor body 1. The semiconductor body 1 comprises a substrate 2 of a first conductivity type and has provided thereon a surface layer 3 of substantially homogeneous thickness and of the second conductivity type. The surface layer is divided into islands 5–9 of the second conductivity type separated from each other by isolation zones 4 of the first conductivity type. The transistors $T_1$ to $T_{11}$ are provided in the various islands. The islands 5 and 6 comprise the transistors $T_1$ and $T_2$ and $T_3$ and $T_4$, respectively. The multi-emitter transistor $T_5$ which is connected to the base zone 10 of the transistor $T_1$ is present in the island 7 and the multi-emitter transistor $T_6$ which is connected to the base zone 10 of the transistor $T_4$ is present in the island 8. The transistors $T_5$ and $T_1$ as well as the transistors $T_6$ and $T_4$ are provided in the islands 7 and 5 and 8 and 6, respectively, each above a buried layer 20, which preferably is highly doped, of the second conductivity type associated with the transistors. The buried layers 20 extend at and are close to the interface between the substrate 2 and the surface layer 3, the interface being denoted in FIG. 3 by the line 21 which is partly a broken line. The two transistors $T_2$ and $T_3$ are also provided above buried layers 20.

In addition to a base zone 10, the transistors $T_1$ to $T_4$ each comprise an emitter zone 11 of the second conductivity type. The islands 5 and 6 which each constitute a common collector zone for two transistors, are each provided with a collector contact layer 12 of the second conductivity type. The multi-emitter transistors $T_5$ and $T_6$ in the islands 7 and 8 belonging to the collector zones of the transistors each have a base zone 13 of the first conductivity type, two emitter zones 14 of the second conductivity type and a collector contact layer 15 of the first conductivity type. The collector contact layers 15 extend between the two emitter zones 14 in recesses in the base zones 13. The emitter zones 14 are thus better separated and electrically substantially independent of each other.

According to the invention, the thickness of the base zones 13 of the multi-emitter transistors $T_5$ and $T_6$ is considerably larger as compared with the thickness of the base zones 10 of the further transistors $T_1$ and $T_4$ connected to said transistors, since the base zones 13 of the multi-emitter transistors during the diffusion of the isolation zones 4 of the same type are diffused deeply in the surface layer 13 down into the associated highly doped buried layers 20 and with the buried layers 20 constitute parts of the collector junctions 16, the base zones 10 of the further transistors $T_1$ and $T_4$ being diffused less deeply in the surface layer 3 and having an accordingly smaller base thickness. The isolation zones 4 extend down into the substrate 2; the simultaneously formed base zones 13, however, are insulated from the substrate in that they are separated from the substrate by the associated buried layers 20. The transistors $T_1$ and $T_4$ comprise base zones 10 with a usual depth of penetration in which the collector junction 17 is separated from the highly doped buried layer 20 by a part 18 of the original high-ohmic surface layer 3.

The simultaneously formed isolation zones 4 and base zones 13 have an equal surface doping concentration and, at least in a transverse direction, an equal variation of the doping concentration due to their simultaneous formation. As a result of differences in the doping concentration of the substratum, for example in those places where the simultaneously formed zones overlap or nearly overlap local zones of the opposite conductivity type or buried layers, small deviations in the concentration gradient and differences in depth of penetration may occur, however. The dimensions in the lateral direction may of course be different. The masking layer often remains behind afterwards on the semiconductor body and is then used as a passivating and insulating layer. In these cases the insulation layer shows an equality in structure in the neighbourhood of the simultaneously formed zones, particularly with respect to differences in thickness.

The p-n-p transistors $T_7$ to $T_{11}$ are provided as lateral transistors in a common island 9. They have each an emitter zone 22 and a collector zone 23, which zones are situated laterally beside each other. The island 9 which serves as a common base zone of the p-n-p transistors is provided with a highly doped base contact layer 24 while a highly doped buried layer 20 is present at the interface between the island 9 and the substrate 2 to reduce the base-series resistance. It is of advantage to form at least the emitter zones 22 simultaneously with the isolation zones 4 so that the emitter zones 22 also extend to the associated buried layers. This has the advantage that the injection of charge carriers of the emitter zones is reduced in a transverse direction and is promoted in a lateral direction towards the collector zone, as a result of which the current amplification factor $\beta$ of the transistors $T_7$ to $T_{10}$ is comparatively high. In the relevant example the collectors 23 are also diffused down to the buried layer. Since the emitter and the collector zones of the lateral transistors are formed simultaneously, the distance between said zones and hence the base thickness is readily defined. The collector-base breakdown voltage will be slightly lower in this case, it is true, but this is often permissible without further measures, in particular in integrated circuits for low voltages and low powers. In addition it is not necessary, although this generally is the case indeed, that the buried layer be highly doped and, by choosing a buried layer having a large depth of penetration into the substrate with a comparatively low doping level, higher breakdown voltages can be achieved with base-series resistances which are still low and with a suitable isolation of the collector junction from the substrate. In an analogous manner, the collector-base breakdown voltage and the collector series resistance of the multi-emitter transistor may also be varied and be adapted for specific applications.

The surface of the semiconductor body is covered with an insulating layer 25 on which extends a pattern of conductive tracks 26 by means of which the circuit elements are connected together as shown in the equivalent circuit diagram of FIG. 1. For that purpose the conductive tracks are connected, via windows in the insulating layer 25 which are denoted by broken lines in FIG. 2, to the semiconductor zones extending in said windows to the semiconductor surface.

The integrated circuit described may form part of a larger electronic system integrated in the semiconductor body or may also be used as a separate semiconductor device. In the latter case, a few of the conductive tracks have, for example, wider portions to which there can be secured in a usual manner connection conductors for connection to the connections of an envelope. Such wide contact pads are shown partly in FIG. 2, denoted by 27.

At the inputs denoted by A in FIG. 1, the integrated circuit shown in FIGS. 1 and 2 comprises an input impedance which is comparatively high for "TTL" gates also in the conductive condition of the gates. In the known "TTL" circuits, the base zones of the multi-emitter transistor and of the inverter are simultaneously formed. According to the invention, the base zone of the multi-emitter transistor is formed simultaneously with the isolation zones 4, inter alia, to increase the base thickness of said transistor. As a result of such larger base thickness, the multi-emitter transistor has a smaller current amplification factor. More important than the reduction of the normal current amplification factor $\beta$, as a result of which the action of the "TTL" circuit is not noticeably influenced, is the fact that at the same time the inverse current amplification factor $\beta_{inverse}$ of the multi-emitter transistor is also reduced. This factor $\beta_{inverse}$ determines the value of the input current and hence the occurring load of the preceding part of the circuit in the conductive condition of the gate in which the collector junction is polarized in the forward direction and the emitter junction is reverse biassed.

Figure 4:
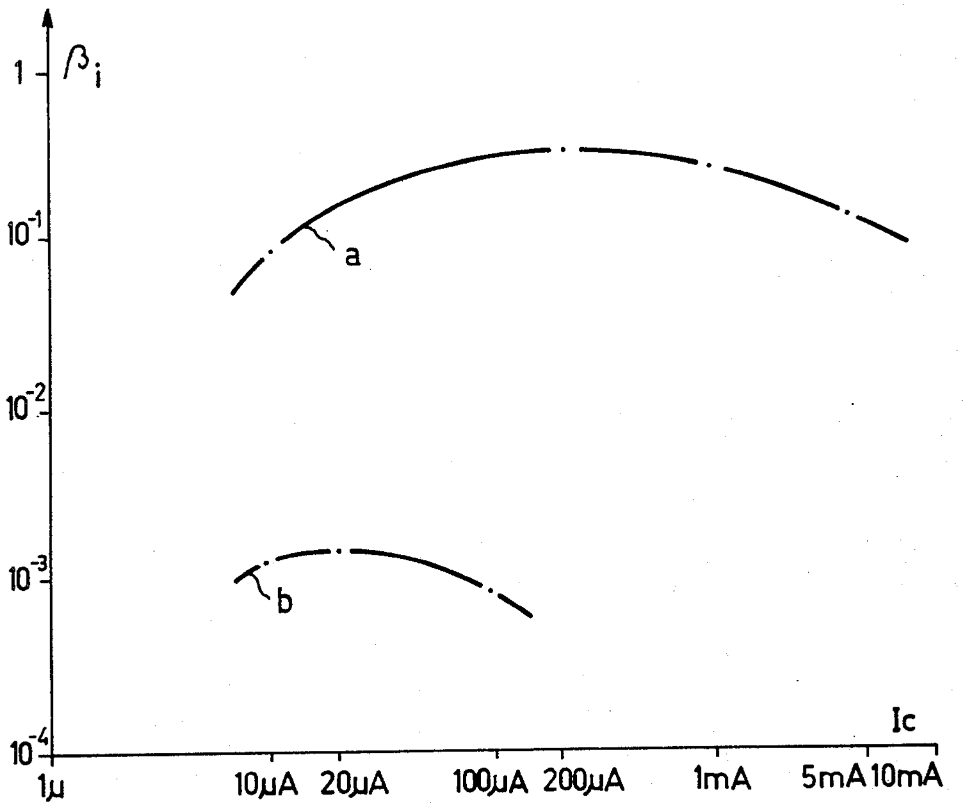
FIG. 4 shows the current amplification factor $\beta_{inverse}$ as a function of the collector current for two transistors.

It has been found that inverse current amplification factor $\beta_{inverse}$ can be considerably reduced by using the invention. FIG. 4 shows by way of example the variation of the current amplification factor $\beta_{inverse(Bi)}$ as a function of the collector current (ie) for two transistors. The curve *a* relates to a conventional "TTL" input transistor, the base zone of which is formed simultaneously with that of the inverter in an n-type epitaxial layer having a thickness of approximately 10–12 $\mu$m and a doping concentration of approximately $10^{16}$ atoms per ccm. In the same epitaxial layer a second multi-emitter transistor was manufactured, the base zone of which transistor was formed simultaneously with the isolation zones but which otherwise was equal to the first multi-emitter transistor. The curve *b* in FIG. 4 shows the variation of the current amplification factor $\beta_{inverse}$ found for the second transistor. The factor $\beta_{inverse}$ is in this case lower by approximately two orders of magnitude. Such a large reduction is difficult to explain by the above-mentioned effect of the large base thickness alone. Particularly with small currents and voltages a second effect occurs which in contrast with the first effect influences only the factor $\beta_{inverse}$. Since the base zone 13 of the multi-emitter transistor extends into a highly doped buried layer 20, the concentration gradients at the collector junction 16 are considerably larger than in the known input transistor in which, as in the inverter in the embodiment, the base zone 10 is situated at a distance from the buried layer and wholly in the original high ohmic material of the surface layer 3. This results in a higher diffusion voltage, as a result of which, in particular with comparatively low currents and voltages, the injection of charge carriers from the collector zone in the base zone is considerably reduced.

It is to be noted in this connection that the diffusion voltage of the parts of the base-collector junction extending substantially transverse to the surface remains substantially unvaried. The contribution of the lateral injection to the factor $\beta_{inverse}$ which normally is already small can still further be suppressed, if desirable, by choosing the distance at the surface between the emitter and collector junctions to be sufficiently large.

An important advantage of the invention is that the reduction of the factor $\beta_{inverse}$ is achieved without adversely influencing the current amplification factors of the further transistors and without a further processing step being necessary in the manufacturing process.

In particular, the current amplification factor $\beta$ of the further transistors may be chosen to be as large as possible in which the $\beta_{inverse}$ preferably is not too low in view of the desirable low value of the saturation voltage; the $\beta$ is, for example, approximately 200 and the $\beta_{inverse}$ is approximately 0.5 to 5.

Moreover, in most cases the conventional gold diffusion may be omitted as a result of which not only an manufacturing step is saved but also new possibilities are obtained. For example, as shown in the embodiment, complementary lateral transistors may be used, which transistors can hardly be used in the known "TTL" circuits due to the conventional gold diffusion. The possibility of using complementary transistors instead of resistors as loads is of particular importance with respect to low power circuits. In such circuits which are operated at low currents and voltages, particularly the increase of the diffusion voltage may be used to reduce $\beta_{inverse}$.

It will be obvious that circuit elements other than n-p-n and p-n-p transistors may also be used in the integrated circuit according to the invention. For example, diodes, resistors and/or capacitors may be provided in the usual manner in the same semiconductor body preferably during the operation steps already required for the transistors.

Figure 5:
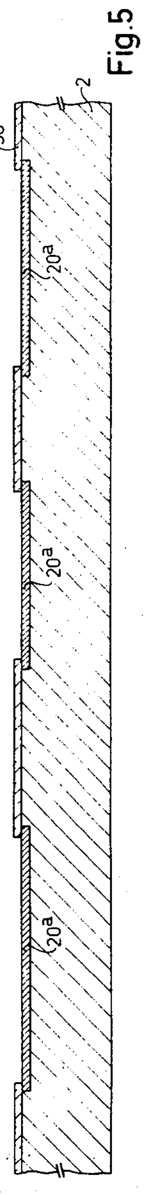
FIGS. 5 to 7 show the semiconductor body of the integrated circuit shown in FIGS. 2 and 3 after various stages of manufacture.
Figure 6:
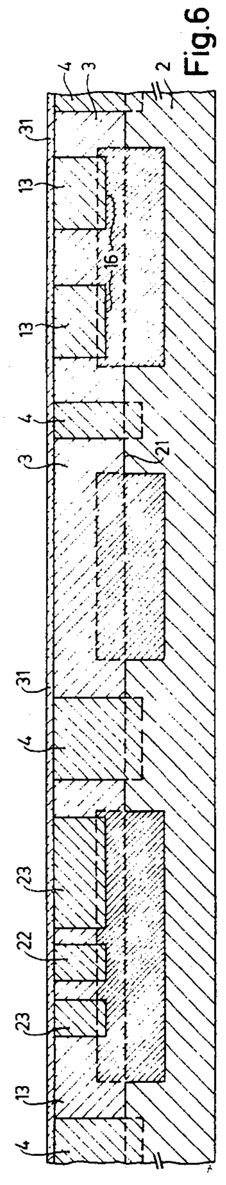

The embodiment described with reference to FIGS. 1 to 3 can be manufactured by means of the photoresist and doping methods conventionally used in semiconductor technology. The buried layers and the various surface zones may be obtained, for example, by ion implantation. Preferably, however, the starting material is a substrate 2, for example, a p-type silicon wafer having a doping concentration of approximately $10^{15}$ to $10^{16}$ atoms per ccm. An apertured masking layer 30, for example, of silicon dioxide, is provided at a surface of the wafer by means of the conventional photoresist methods (FIG. 5). In a usual manner, for example, arsenic-doped surface zones 20a having a surface concentration of, for example, $10^{19}$ atoms per ccm, are then diffused. For that purpose the semiconductor wafer is heated for approximately 1 to 3 hours at approximately 1200°C in an arsenic-containing gas mixture and for approximately 16 hours at approximately 1200°C in an oxygen atmosphere. The masking layer 30 is removed and an n-type epitaxial layer 3 (FIG. 6) of substantially homogeneous thickness of approximately 10 μm and a doping concentration of, for example, approximately $10^{16}$ atoms per cccm is then grown in known manner. A new masking layer 31, in which apertures are made in those places where isolation zones 4 are necessary and in addition in the places which are situated above a zone 20a which is now buried by the epitaxial layer 3 and where the base zones 13 of the multi-emitter transistors are to be formed, is then provided at the free surface of the epitaxial layer. In the present embodiment apertures are also made simultaneously in the masking layer 31 for diffusing the emitter and collector zones 22 and 23 of the p-n-p transistors. During the subsequent diffusion treatment, the semiconductor wafer is heated at approximately 1100°C, for example, for approximately half an hour, in a gas mixture which contains, for example, boron. The plate is then heated for approximately 3 hours at approximately 1200°C in an oxidizing atmosphere. During the two thermal treatments of the diffusion step, the boron diffuses at the area of the isolation zones 4 down into the substrate 2, whereas at the areas of the base zones 13 and of the emitter and collector zones 22 and 23, respectively, in the epitaxial layer 3, the boron meets the arsenic which during this treatment and also during the growing of the epitaxial layer 3 diffuses from the interface 21 both in the epitaxial layer 3 and deeper into the substrate 2. Since the doping concentration of the buried layer 20 is considerably higher than that of the original material of the epitaxial layer, the base zones 13, unlike the isolation zones 4, do not extend down into the substrate but meet the arsenic of the buried layers and constitute with the buried layers, parts of the collector junctions 16. The result is a similar structure as shown in FIG. 6 in which the apertures used as diffusion windows in the masking layer 31 consisting of, for example, silicon dioxide, are closed again due to the heating in an oxidiaing atmosphere.

In the next manufacturing step, apertures are made in the masking layer 31 at the area where the base zone of the inverter is to be diffused, during which step apertures for p-type zones of any further circuit elements to be formed simultaneously may also be provided. The semiconductor wafer is heated at approximately 950°C for 30 minutes in a boron-containing atmosphere and then at approximately 1200°C for approximately 30 minutes in an oxidizing atmosphere.

Figure 7:
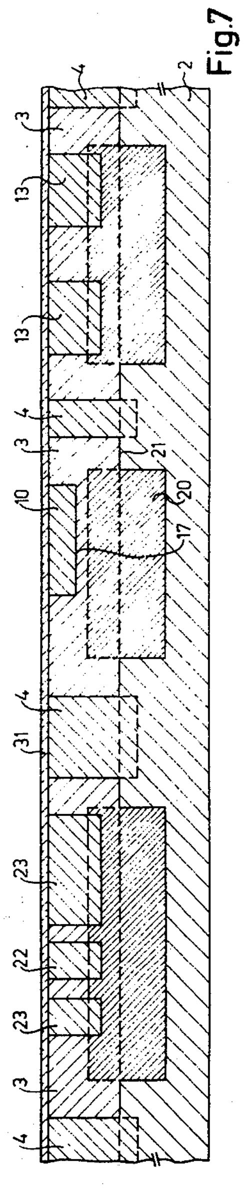

The result is shown in FIG. 7. The base zones 10 and the collector junctions 17 between the base zones and the adjacent parts of the relevant islands are situated at a distance from the associated highly doped buried layers 20. So the p-n junctions 17 are situated in the original material of the epitaxial layer 3.

A further diffusion step is then carried out in which in a usual manner the n-type emitter zones 14 of the multi-emitter transistors, the emitter zones 11 of the inverters, the collector contact layers 12 and 15 as well as the base contact layer 24 are simultaneously provided through apertures in the insulating layer 31, for example by a thermal treatment for approximately 20 minutes at approximately 1000°C in a phosphorus-containing atmosphere and a further thermal treatment for approximately 20 minutes at approximately 1050°C in an oxidizing atmosphere. The sheet resistance of the diffusion is, for example, approximately 5 ohm. Due to the difference of the doping concentration of the regions to be doped, the depth of penetration of the contact layers is slightly larger than that of the emitter zones although the contact layers and the emitter zones are formed simultaneously.

It will be obvious that during the last two diffusion steps also the diffusion in the isolation zones 4, the base zones 13, the emitter and collector zones 22 and 25, as well as in the buried layers is still slightly continued. However, in the present example, a significant shift of the relevant p-n junctions does not occur in this stage.

The masking layer 31 may remain behind as an insulating layer 25 on the semiconductor surface or a new insulating layer 25, for example of silicon oxide and/or silicone nitride, may also be provided. Apertures for contacting the various semiconductor regions are provided in the insulating layer 25 in a usual manner, after which a pattern of conductive tracks 26, 27 is formed, for example, by vapour deposition and etching of a thin aluminium layer (FIG. 3).

The buried layers extend from the interface 21 to approximately 5 μm in the epitaxial layer 3 and to approximately 7 μm in the substrate 2. The parts of the p-n junctions 16 extending substantially parallel to the semiconductor surface are situated approximately 7 μm below the semiconductor surface. The depth of penetration of the base zones 10 is approximately 3.5 μm and that of the emitter zones 11 and 14 is approximately 2.5 μm. The base thickness of the inverter thus is approximately 1 μm and that of the multi-emitter transistor approximately 5.5 m. Without increasing the number of processing steps during the manufacture, a considerable increase of the base thickness of the multi-emitter transistor is thus obtained. It is to be noted that the current amplification factor $\beta$, so with an injecting emitter zone, is still approximately 1 to 10 which is considerably higher than is required for a good electric performance of the "TTL" circuit. The "TTL" circuit can still operate when the multi-emitter transistor has a current amplification of minimum approximately 0.1; normally a $\beta$ of only 0.01 is necessary for base circuits of the multi-emitter transistor of more than 10 μA. The $\beta$ of the inverters in the present embodiment is approximately 200.

It will be obvious that the invention is not restricted to the embodiments described but that many variations are possible to those skilled in the art without departing from the scope of this invention. For example, other semiconductor materials, for example, germanium or $A^{III}B^{V}$ compounds may be used. The doping materials, the diffusion times, as well as the diffusion temperatures may be adapted extremely to the requirements imposed upon the circuit to be integrated. The conductive tracks may also consist, for example, of molybdenum or gold or of several materials. Although in the "TTL" circuit according to the above-described embodiment the collector of the multi-emitter transistor is directly connected to the base zone of the inverter, the invention may of course also be used advantageously in multi-emitter transistors of this type in which said connection is produced via a few interposed elements, for example transistors. If desirable, for example, the said resistor for adjusting the current ratio of the current sources, may also be integrated in the semiconductor body.

What is claimed is:

1. An integrated circuit device comprising:

a. a semiconductor substrate of a first conductivity type;

b. a surface layer of a second conductivity type located on said substrate;

c. isolation diffusion zones of said first conductivity type extending from the surface of said surface layer into said substrate, said isolation diffusion zones dividing said surface layer into a plurality of islands;

d. at least one multi-emitter transistor of one type located individually within one of said islands and comprising a collector region and a base region;

e. at least one further transistor of said one type located individually within another one of said islands, said further transistor including a base region electrically connected to said collector region of said multi-emitter transistor, said base region of said multi-emitter transistor significantly exceeding in thickness said base region of said further transistor; and f. local buried layers of said second conductivity type located in at least said one and said other islands at the interface between said substrate and said surface layer, said buried layers having dimensions within the boundaries of their respective said islands, said multi-emitter and said further transistors being disposed above their respective said buried layers, said base region of said multi-emitter transistor extending from said surface into its associated buried layer to a greater depth than said base region of said further transistor and constituting with its associated buried layer part of the collector junction of said multi-emitter transistor, said base region of said further transistor being spaced from its associated buried layer.

2. An integrated circuit device as recited in claim 1, further comprising lateral transistors in said surface layer and having diffused emitter and collector zones situated laterally beside each other at said surface of said surface layer.

3. An integrated circuit device as recited in claim 2, wherein said lateral transistors overlie respective ones of said buried layers and at least said emitter zones of said lateral transistors extend down to their associated said buried layers.

4. An integrated circuit device as recited in claim 1, wherein said multi-emitter transistor and said further transistor are each planar transistors.

5. An integrated circuit device as recited in claim 4, wherein said multi-emitter transistor comprises a collector region and a base zone that comprises a recess, said collector region extending into said recess and said emitters being located at opposite sides of said recess.

6. An integrated circuit devices as recited in claim 1, wherein said substrate and said surface layer define an interface and said buried layers are disposed at said interface.

7. An integrated circuit device as recited in claim 1, wherein said multi-emitter transistor and said further transistor comprise respective emitter regions of substantially equal thickness to each other.

* * * * *

UNITED STATES PATENT AND TRADEMARK OFFICE

CERTIFICATE OF CORRECTION

PATENT NO. : 3,911,470

DATED : October 7, 1975

INVENTOR(S) : HEINZ WALTER RUEGG

It is certified that error appears in the above-identified patent and that said Letters Patent are hereby corrected as shown below:

On the title page, Section [30] change "7016710"

to --7016719--.

Signed and Sealed this

*tenth* Day of *February 1976*

[SEAL]

*Attest:*

RUTH C. MASON
*Attesting Officer*

C. MARSHALL DANN
*Commissioner of Patents and Trademarks*